(12) United States Patent
Wilkinson et al.

(10) Patent No.: US 6,381,286 B1
(45) Date of Patent: Apr. 30, 2002

(54) CARTESIAN LOOP TRANSMITTER

(75) Inventors: Ross J. Wilkinson; Peter B. Kenington, both of Bristol; Joseph P. McGeehan, Wiltshire; Mark A. Beach, Bristol; Andrew Bateman, Bath, all of (GB)

(73) Assignee: University of Bristol, Bristol (GB)

( * ) Notice: Subject to any disclaimer, the term of this patent is extended or adjusted under 35 U.S.C. 154(b) by 0 days.

(21) Appl. No.: 08/952,524

(22) PCT Filed: May 22, 1996

(86) PCT No.: PCT/GB96/01226

§ 371 Date: May 7, 1998

§ 102(e) Date: May 7, 1998

(87) PCT Pub. No.: WO96/37949

PCT Pub. Date: Nov. 28, 1996

(30) Foreign Application Priority Data

May 22, 1995 (GB) .............................................. 9510313

(51) Int. Cl.⁷ .......................... H04K 1/02; H04L 25/03; H04L 25/49
(52) U.S. Cl. .......................... 375/296; 455/126; 330/51
(58) Field of Search ................................. 375/295, 296, 375/297, 254, 285; 455/91, 115, 126; 330/2, 107, 51, 75, 84, 85, 97, 149, 284, 291, 290, 295

(56) References Cited

U.S. PATENT DOCUMENTS

| | | | |
|---|---|---|---|
| 4,291,277 A | * | 9/1981 | Davis et al. ................. 330/149 |
| 4,937,535 A | * | 6/1990 | Underwood et al. ........ 330/284 |
| 5,065,922 A | | 11/1991 | Leitch |
| 5,066,923 A | * | 11/1991 | Gailus et al. ................ 330/107 |
| 5,105,446 A | * | 4/1992 | Ravoalavoson et al. .... 330/284 |
| 5,134,718 A | * | 7/1992 | Gailus ......................... 455/102 |
| 5,281,924 A | * | 1/1994 | Maloberti et al. .......... 330/253 |
| 5,351,016 A | * | 9/1994 | Dent ........................... 332/103 |
| 5,381,108 A | * | 1/1995 | Whitmarsh et al. ............ 330/2 |
| 5,396,196 A | * | 3/1995 | Blodgett ..................... 332/103 |
| 5,469,105 A | * | 11/1995 | Sparks ........................ 330/129 |
| 5,486,789 A | * | 1/1996 | Palandech et al. .......... 330/149 |
| 5,535,247 A | * | 7/1996 | Gailus et al. ................ 375/297 |
| 5,574,994 A | * | 11/1996 | Huang et al. ................ 455/126 |
| 5,623,226 A | * | 4/1997 | Whitmarsh et al. ............ 330/2 |
| 5,628,059 A | * | 5/1997 | Kurisu ........................ 455/126 |
| 5,793,817 A | * | 8/1998 | Wilson ........................ 375/297 |

FOREIGN PATENT DOCUMENTS

| | | |
|---|---|---|
| EP | 0 552 494 | 7/1993 |
| EP | 0 598 585 | 5/1994 |
| EP | 0 648 012 | 5/1995 |
| GB | 2 210 744 | 6/1989 |
| GB | 2 265 270 | 9/1993 |
| GB | 2 282 290 A | 3/1995 |
| WO | 94/05078 | 3/1994 |
| WO | 95/01009 | 1/1995 |
| WO | 95 06354 | 2/1995 |

* cited by examiner

*Primary Examiner*—Chi Pham
*Assistant Examiner*—Jean Corrielus
(74) *Attorney, Agent, or Firm*—Nixon & Vanderhye

(57) ABSTRACT

A Cartesian loop transmitter for transmitting baseband signals is disclosed. The disclosed Cartesian loop includes a forward path having a first input for receiving the baseband signals and a second input and a feedback path having an input from the forward path. The forward path including an upconverter to upconvert the input signals to a signal to be transmitted, an attenuator having selectable attenuation and a plurality of power amplifier stages. The feedback path including a pin diode attenuator having selectable attenuation and a downconverter to downconvert the input from the forward path. The feedback path provides an error signal indicative of the non-linearity of the forward path to the second input of the forward path.

22 Claims, 7 Drawing Sheets

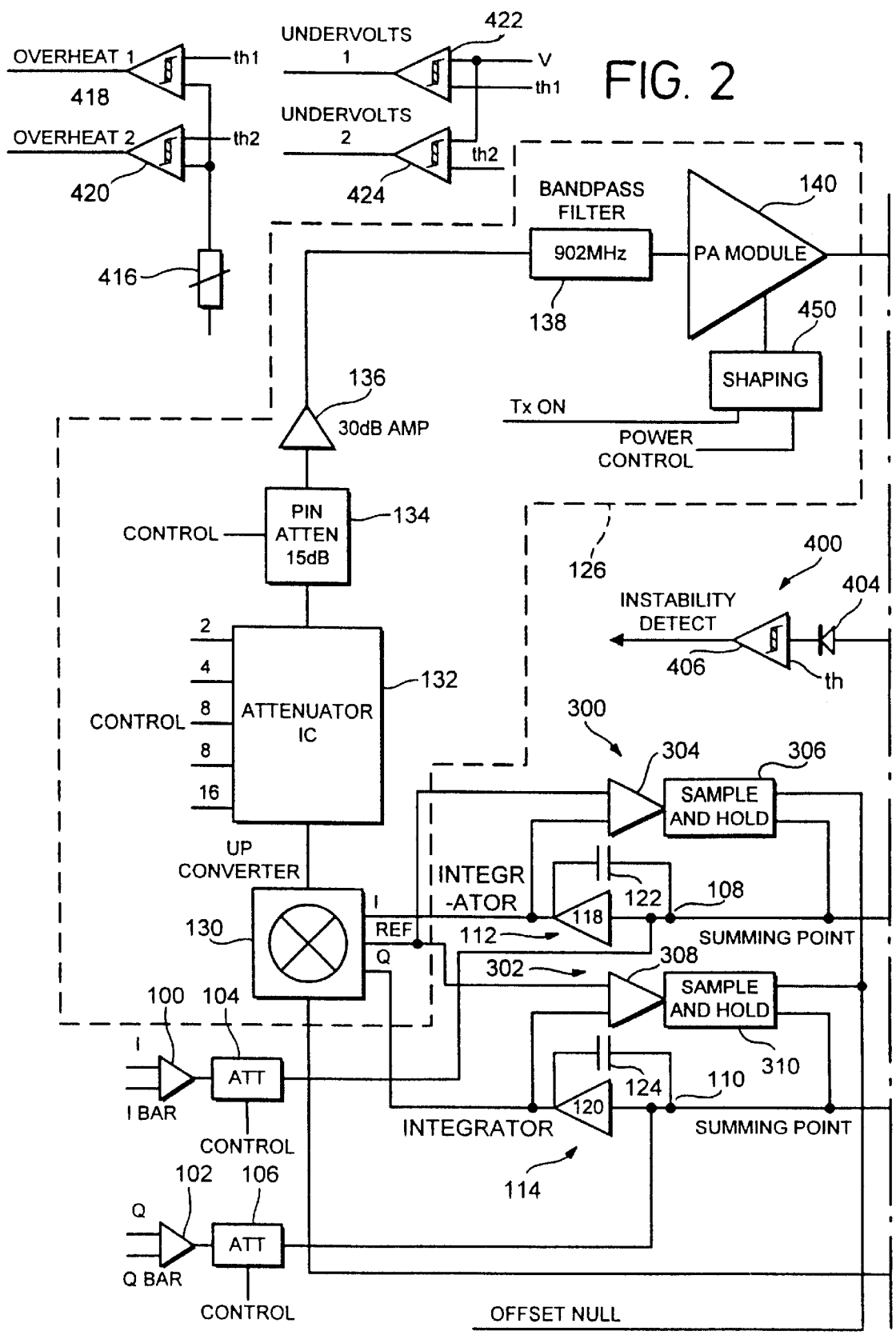

CARTESIAN LOOP TRANSMITTER

BACKGROUND OF THE INVENTION

This invention generally relates to radio transmitters. More specifically, it relates to apparatus and method for providing linear radio transmitters via cartesian loop circuitry.

Today's radio communications systems typically operate in narrowly defined bands of frequency. Consequently, the transmitters in radio communication systems require power amplifiers that are capable of operating in a highly linear fashion to maintain the spectral efficiency, thereby minimizing the resulting interference.

The use of cartesian loop circuits to achieve linear power amplification in communication system transmitters is known in the art. A known cartesian loop circuit is shown in FIG. 1 and is described in an article entitled "RF Linear Amplifier Design," by P. B. Kenington and A. Bateman, published in the Proceedings of RF Expo West at pages 223 to 232 in March of 1994.

The cartesian loop circuit of FIG. 1, however, has several limitations. One general limitation is the inability to provide adequate power control, a necessary function in most communication system transmitters. By way of example only, existing circuits do no provide an adequate range of power control. Further, existing circuits also do not provide adequate fine power control. There are other limitations in the power control offered by existing cartesian loop circuits.

Existing cartesian loop circuits also do not provide any noise filtering to remove the noise introduced by the cartesian loop. Thus, existing cartesian loop circuits provide noisy operation. Existing cartesian loop circuits also do not provide adequate calibration technique to compensate for DC offset of components and to compensate for phase variations in the cartesian loop. All of these limitations place a limit on the accuracy of operation.

Other limitations include the lack of instability detection, the lack of adaptive operation during overheat situations and during undervoltage situations and the lack of any type of detection of the transmission mask to ensure the proper operation of the cartesian loop transmitter.

In view of these and other limitations, new and improved cartesian loop circuitry is needed, particularly for use in linear transmitters in radio communication systems.

SUMMARY OF THE INVENTION

The present invention provides method and apparatus for nulling DC offsets in a feedback path of a cartesian loop that consists of a forward path and the feedback path, thereby minimizing degradation of the performance of the cartesian loop. In accordance with the method of nulling DC offsets, the operation of the forward path is disabled and the DC offset in the feedback path is sensed and stored. The DC offset in the feedback path is then subtracted out while the forward path is enabled. The downconverter is preferably driven with its local oscillator during this process since the local oscillator can affect the DC offset. In accordance with a preferred embodiment, if system timing constraints do not permit the local oscillator to lock at its specified stability, the storing of the DC offset is done when the local oscillators have reached a predetermined stability.

The DC offset nulling is preferably performed with a sample and hold that senses and acquires the DC offset in the feedback path when the forward path is disabled. The forward path is disabled preferably by disabling a power amplifier in the forward path.

In accordance with another aspect of the present invention, apparatus and method for filtering out the noise in a cartesian loop circuit are provided, thereby improving full duplex operation in a communication system using the cartesian loop transmitter. In accordance with the apparatus of this aspect of the present invention, a noise filter is provided in the forward path that blocks frequencies outside the frequency band over which signals are transmitted. The filter is preferably a bandpass filter having a bandwidth approximately equal to the frequency band of the signal to be transmitted. Thus, if the cartesian loop is being used in a frequency hopping system—wherein a plurality of frequency channels are used—the filter has a bandwidth that allows transmission over all frequency channels. Importantly, the noise filter blocks frequencies generated by the components in the cartesian loop that are within the band of frequencies used to receive signals.

In accordance with another aspect of the present invention, apparatus and method for detecting when a cartesian loop is operating in an unstable fashion is provided. In accordance with the method of this aspect of the present invention, the baseband signals in the cartesian loop are monitored to detect when they have a frequency outside the bandwidth of the baseband input signals. When a frequency outside the bandwidth is detected, the operation of the cartesian loop is controlled to try to restore stable operation or to minimize the possibility of the breaking of the transmission mask.

In accordance with another aspect of the present invention, apparatus and method for detecting undervoltage and over-heat operation are provided. To detected over-heat operation, the temperature at which the cartesian loop circuit operates is detected. When the temperature exceeds a first threshold, the power output of the cartesian loop circuit is lowered. When the temperature exceeds a second threshold, operation of the cartesian loop circuit is stopped. Alternatively or in addition, the gain of the loop can be differentially controlled or the phase of the loop can also be controlled. These actions can be taken in any order with any priority.

To detect undervoltage operation, the power supply voltage supplied to the cartesian loop circuit is detected. When the voltage falls below a first threshold, the power output of the cartesian loop circuit is lowered. When the voltage falls below a second threshold, operation of the cartesian loop circuit is stopped. Alternatively or in addition, the gain of the loop can be differentially controlled or the phase of the loop can also be controlled. These actions can be taken in any order with any priority.

In accordance with another aspect of the present invention, apparatus and method for controlling the phase of a cartesian loop having one or more power control components is provided. In accordance with the method, the on/off status of each power control component in the cartesian loop is determined. Then, the phase of the cartesian loop is adjusted depending on which components are in the loop. This adjusts for the varying phase delays caused by components in the loop. In accordance with another aspect of this invention, when the cartesian loop is used in a communication system that communicates over a plurality of frequency channels the frequency used for a communication is determined and the phase of the cartesian loop is adjusted in accordance with the frequency.

In accordance with another aspect of the present invention, when a cartesian loop transmitter is used in a time slotted communication system, apparatus and method are provided to control the transmissions at the start of an active time slot to allow the cartesian loop to reach full operation before full power transmission. In accordance with the method, the timing of an active time slot is determined. Then, the output from the cartesian loop during the start of the active time slot is delayed. This is preferably accomplished by ramping the power control signal to an output power amplifier in the forward path of the cartesian loop circuit.

In accordance with another aspect of the present invention, apparatus and method for simply controlling the power output of the cartesian loop transmitter are provided. In accordance with the method, one or more stages of a multi-stage power amplifier in the forward path of a cartesian loop are bypassed with a bypass switch when lower power output is desired. It is preferred to control the phase of the cartesian loop as stages are bypassed to account for the changes in loop phase.

In accordance with another aspect of the present invention, apparatus and method for controlling the power output of a cartesian loop by selectable loop attenuation with a PIN diode circuit are provided. In accordance with the apparatus, the forward path of the loop includes a first input for receiving baseband signals, a second input, means to upconvert the input signals to a signal to be transmitted, an attenuator having selectable attenuation and a plurality of power amplifier stages. The feedback path includes an input from the forward path, a PIN diode attenuator having selectable attenuation and means to downconvert and an output that provides a feedback signal to the second input. It is preferred to control the attenuation so that the attenuation removed in the forward path equals the attenuation added in the reverse path and vica versa.

In accordance with a further aspect of the present invention, apparatus and method that allow selectable control of the output power of the loop are provided. In accordance with the apparatus, the loop includes a forward path having a first input for the baseband signals, a second input, means to upconvert the input signals to a signal to be transmitted, an attenuator having selectable attenuation, an amplifier having selectable amplification and a plurality of power amplifier stages. The feedback path includes an input from the forward path, an attenuator having selectable attenuation, an amplifier having selectable amplification and means to downconvert the input from the forward path. Again, it is preferred to match gain control in the forward path and in the feedback path.

In accordance with yet another aspect of the present invention, apparatus and method for providing fine and coarse control of the output power of the cartesian loop is provided. The loop circuit includes means for controlling the gain of the baseband signals in addition to the gain control elements previously discussed. It is preferred to provide fine control of the cartesian loop power output by the means for controlling the gain of the baseband signals and to provide coarse control of the cartesian loop power output by controlling the gain control means in the forward and feedback paths.

The invention will now be described in connection with certain illustrated embodiments; however, it should be clear to those skilled in the art that various modifications, additions and subtractions can be made without departing from the spirit and scope of the claims.

DESCRIPTION OF THE PREFERRED EMBODIMENT

Figure 1:
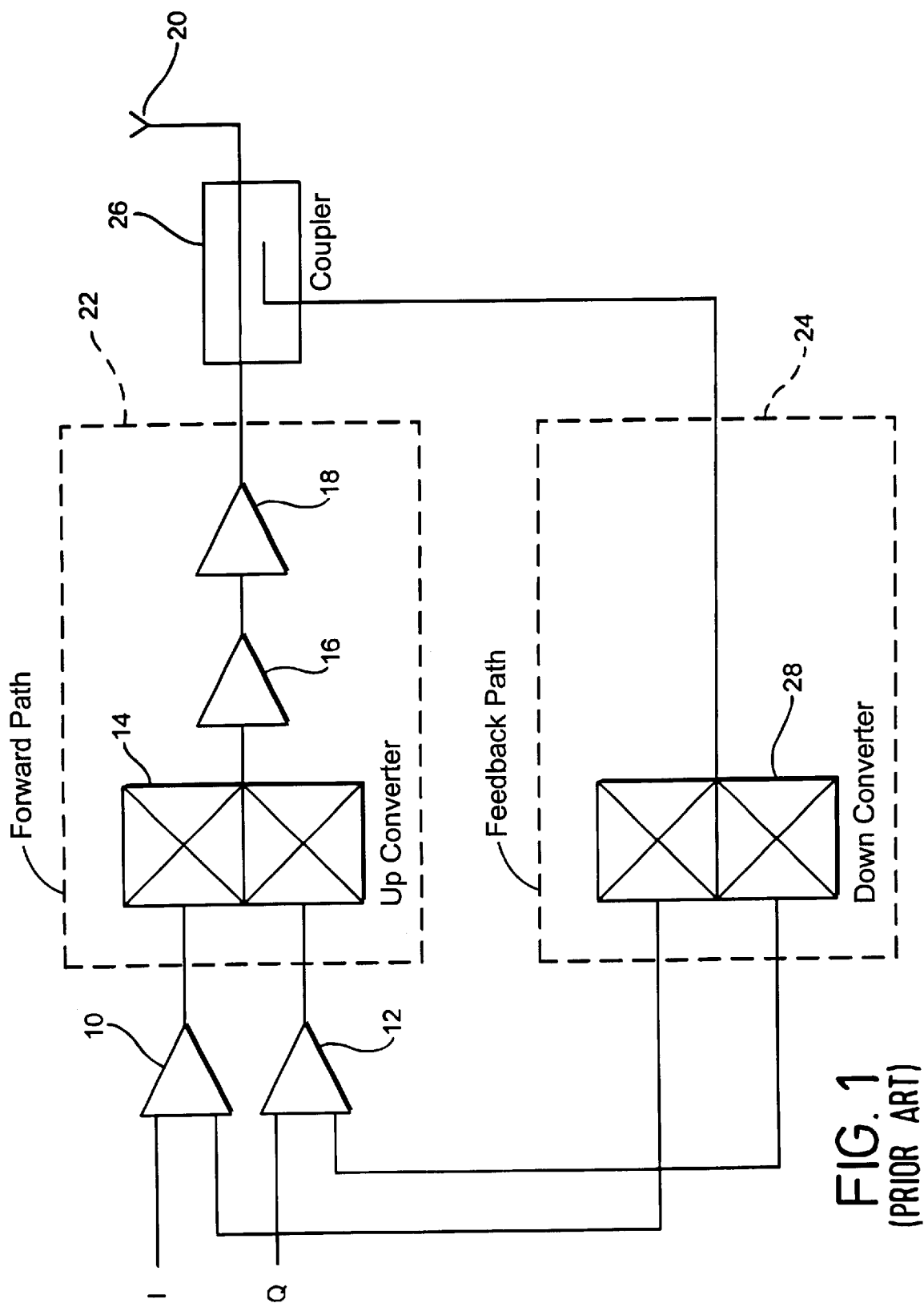
FIG. 1 illustrates a block diagram of a known cartesian loop circuit.

Referring to FIG. 1, a known cartesian loop circuit is illustrated. The circuit receives I and Q inputs at baseband frequency in the differential amplifiers 10 and 12, respectively. The I and Q signals are then upconverted to a RF frequency by an upconverter 14. The upconverter signals are amplified by an amplifier stage, represented by a pair of amplifiers 16 and 18. The signals are then transmitted from an antenna 20.

The transmission path 22 is referred to as the forward path. The forward path 22 is similar to the circuitry found in any transmitter. In the circuit of FIG. 1, however, the amplifiers 16 and 18 do not need to be highly linear, instead they can be less expensive non-linear components, mainly because of the correction of non-linearities afforded by a feedback path 24 provided by cartesian loop circuits.

The input to the feedback path 24 is generated by a coupler 26 which outputs a portion of the signal from the forward path 22 to the feedback path 24. The coupled signal is downconverted to the baseband frequency by a downconverter 28. The downconverted signals are input to the differential amplifiers 10 and 12. The amplifiers 10 and 12 then implement a subtraction process to generate error signals which provide a correction of any non-linear operation of the circuit.

Figure 2A:
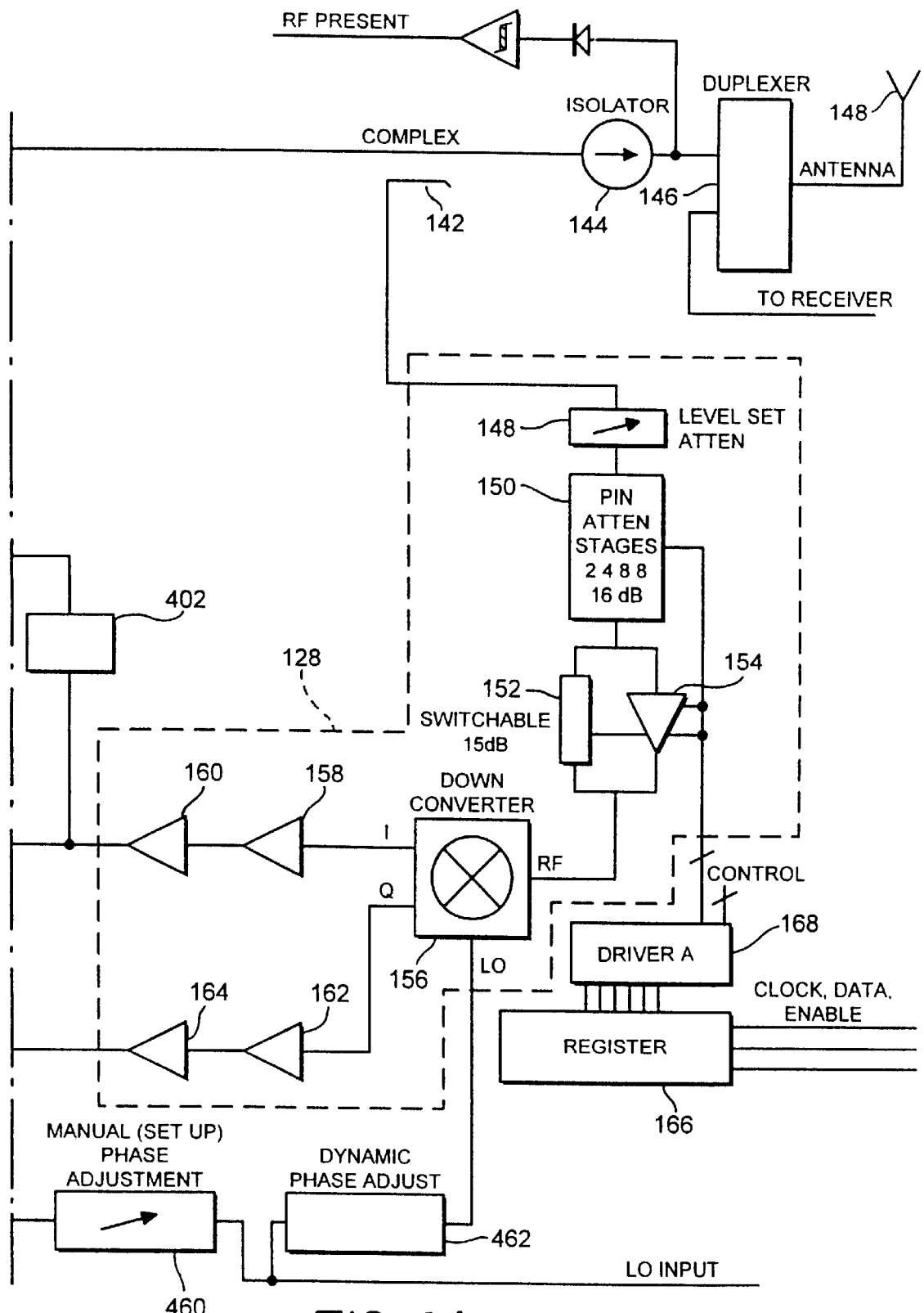
FIG. 2 illustrates a block diagram of a cartesian loop circuit which implements several aspects of the present invention.

Referring to FIG. 2, a preferred embodiment of a cartesian loop circuit that implements several aspects of the present invention is illustrated. Differential I and Q inputs are supplied to differential amplifiers 100 and 102, respectively. The I and Q outputs from the amplifiers 100 and 102 are input to attenuators 104 and 106, respectively. The outputs from the attenuators 104 and 106 are sent to summing points 108 and 110, respectively.

The summing point 108 provides the input to a loop filter 112 and the summing point 110 provides the input to a loop filter 114. The loop filters 112 and 114 are implemented as integrators with amplifiers 118 and 120, respectively, and with capacitors 122 and 124, respectively. The loop filters 112 and 114 provide the filtering and the gain needed for the cartesian loop to constrain the gain-bandwidth of the loop within stable limits.

The loop filters 112 and 114 provide the outputs to the forward path 126. As previously described, one input to the summing points 108 and 110 comes from the I and Q signals, respectively. The other input to the summing points 108 and 110 comes from a feedback path 128 which provides a measure of the error of the operation of the cartesian loop.

The outputs from the loop filters 112 and 114 are input to an upconverter 130. The upconverter 130 converts the I and Q outputs from the loop filters 112 and 114, which are at a baseband frequency, to a RF frequency. In this case, the preferred RF frequency is 900 MHz.

The RF signal from the upconverter 130 is sent to an attenuator 132 and then to another attenuator 134. The signal is then sent to an amplifier 136 and then to a bandpass filter 138. The signal is then sent to a power amplifier module 140 which amplifies the signal prior to transmission. The amplified signal is then sent from the power amplifier 140 through a coupler 142, an isolator 144 and a duplexer 146 to an antenna 148 which transmits the signals.

The coupler 142 transmits a portion of the signal from the forward path 126 to the feedback path 128. In the feedback path 128, the signal is sent to an attenuator 148, then to an attenuator 150 and then to an amplifier stage consisting of a switchable attenuator 152 and a switchable amplifier 154. The power controlled signal is then sent to a downconverter 156. The downconverter 156 converts the signal in the feedback path 128 to a baseband signal.

The I and Q outputs from the downconverter 156 are sent through the amplifiers 158 and 160 and through the amplifiers 162 and 164, respectively. The amplifier 160 provides the output to the summing point 108 and the amplifier 164 provides the output to the summing point 110.

Power Control

The power control features provided in the embodiment of the cartesian loop shown in FIG. 2 in accordance with several aspects of the present invention will now be discussed. The I and Q inputs are initially input through the attenuators 104 and 106. The attenuators 104 and 106 provide 15 dB of attenuation when enabled and pass the I and Q signals through without attenuation when disabled. The attenuators 104 and 106 are controlled by the control signal CONTROLS which is provided through the register 166 and the driver 168 from the communication system. Thus, the attenuators 104 and 106 provide gross power control, providing 15 dB of attenuation when lower power output is desired and 0 dB of attenuation when higher output power is desired.

Then the I and Q signals are input to the cartesian loop circuit and upconverted by the upconverter 130 to a frequency between 896 MHz to 901 MHz, or some other desired frequency. After the upconversion, the signal in the forward path 126 is again power controlled by the attenuator 132, the PIN diode attenuator 134 and the amplifier 136. The attenuator 132 in the case of FIG. 2 is a 2-4-8-8-16 attenuation integrated circuit that allows the following attenuations to be switched in and out of the forward path 126: 2 dB, 4 dB, 8 dB, 8 dB and 16 dB. The attenuator 132, therefore, provides up to 32 dB of attenuation in 2 dB steps. As such, the attenuator 132 can be used to provide fine power control in 2 dB increments in the forward path 126. The attenuator 132 can be implemented by the part number RF2410, made by RF MicroDevices. The attenuator 132 is digitally controlled by the control signals CONTROL which are provided by the communication system.

The PIN diode attenuator 134 preferably provides 15 dB of attenuation when the attenuator 134 is enabled and 0 dB of attenuation when not enabled. The attenuator 134 is preferably enabled and disabled under control of the control signal CONTROL from the communication system. Thus, the attenuator 134 provides gross power control in the forward path 126.

The amplifier 136 in the forward path 126 provides 30 dB of gain. Then, after filtering by the noise bandpass filter 138, the power amplifier 140 provides another 30 to 40 dB of gain. In accordance with one embodiment of the present invention, the power output of the cartesian loop can also be controlled by varying the signal on the power pin of the power amplifier 140. So, for example, if a Hitachi PF0121 power amplifier is used in FIG. 2, the power output of the amplifier 140 can be decreased by decreasing the signal POWER CONTROL which results in decreased output from the loop. Conversely, the power output of the amplifier 140 can be increased by increasing the signal POWER CONTROL which results in increased output from the loop. As gain is increased or decreased in the amplifier 140, a corresponding change should be implemented in the feedback path 128, so that overall loop gain is maintained. After power amplification, the signal is then output through the antenna 148.

So far, the circuit of FIG. 2 provides 15 dB of attenuation before the loop. Then, the forward path 126 of the loop provides up to 47 dB of attenuation. All of the attenuation is under control of the system controller in the communication system. The forward path 126 also provides a first 30 dB amplification stage and a second 30 to 40 dB amplification stage before the signal is provided to the antenna 148. It is understood that the amplifiers shown in FIG. 2 in fact represent several stages of amplifiers.

The power control in the feedback path 128 will now be discussed. As stated before, the feedback path 128 starts with the coupler 142 which, in the case of FIG. 2, couples approximately 1.0% of the signal from the forward path 126. The coupled signal is then attenuated by the level set attenuator 148. The level set attenuator is provided to allow calibration of the loop to compensate for tolerance variations from circuit to circuit and to set the initial power output of the loop circuit.

Then the signal is attenuated by a 2-4-8-8-16 attenuator 150. The attenuator 150 balances the attenuator 132 in the forward path 126. The attenuator 150 is preferably a PIN diode circuit which provides a total of up to 32 dB of attenuation in 2 dB increments. The selection of the amount of attenuation is provided by control signals from the system controller of the communication system which are stored in the register 166.

The signal is then passed to a switchable amplification stage that includes the 0 dB attenuator 152 and the 15 dB amplifier 154. When amplification of the output signal is desired by the system controller of the communication system, the amplifier 154 is disabled and the 0 dB attenuator is enabled by the control signals from the register 166. When a lower power output is desired, the system controller enables the amplifier 154 and disables the attenuator 152 so that the signal in the feedback path is amplified.

When attenuation or gain is switched in and out of either the forward path 126 or the feedback path 128, it is preferred to switch in or out an equal amount of attenuation or gain in the other path. Doing this maintains the balance of the loop by preventing a change in overall loop gain despite variations in output power. For example, to keep the loop balanced, it is preferred to balance a gain in power in the forward path 126 with an attenuation of power in the feedback path 128. Similarly, it is preferred to balance an attenuation of power in the forward path 126 with a gain of power in the feedback path 128. Thus, if attenuation is switched in the forward path 126, it is preferred to switch out an equal attenuation in the feedback path 128.

The circuit of FIG. 2 provides fine and coarse control of power output with components inside and outside the loop. In the case of FIG. 2, fine control refers to steps of 1 to 2 dB of power control while coarse control refers to larger steps of power control, although in other systems the steps of fine and coarse control may have different values. In FIG. 2, 15 dB of power control is provided outside the loop by the attenuators 104 and 106. Additionally, it is preferred to utilize a digital signal processor (DSP) to provide the I and Q signals, as will be explained and illustrated in FIG. 3. The DSP provides fine control of power output in 1 and 2 dB steps. Since both of these power control mechanisms are outside the loop, there is no need to balance the use of these mechanisms. Fine power control is provided in FIG. 2 within the loop by the attenuators 132 and 150, the use of these attenuators being balanced as previously explained. Coarse power control is provided in FIG. 2 by the attenuators 134 and 152 and by the amplifier 154, the use of each of these components being balanced as previously explained.

Figure 3:
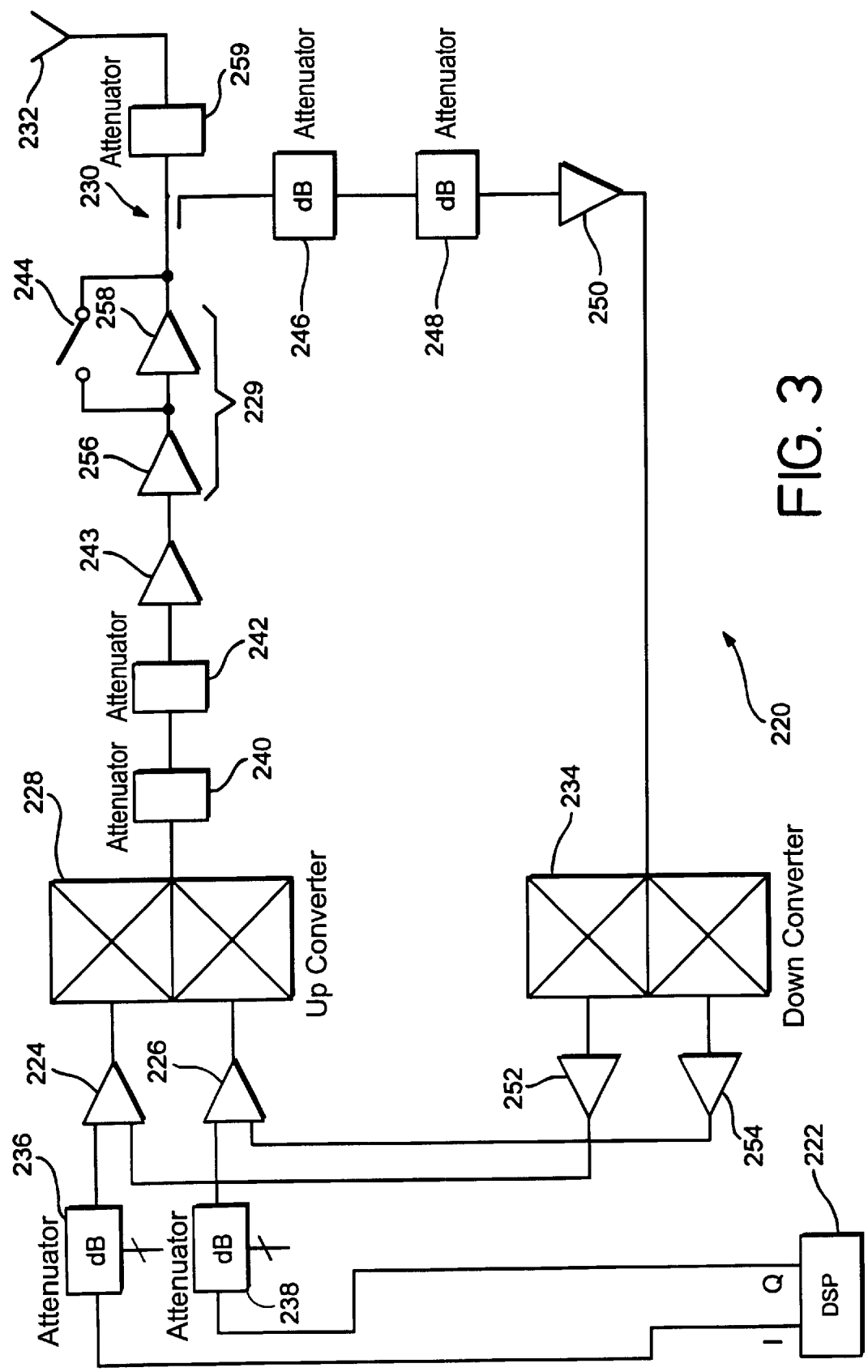
FIG. 3 illustrates a block diagram of a cartesian loop with power control features in accordance with a preferred embodiment of the present invention.

Fig. 2 illustrates a particular embodiment of a cartesian loop in accordance with the present invention. In FIG. 3, a block diagram of another cartesian loop circuit with various power control components is illustrated. In FIG. 3, I and Q signals, which are to be transmitted, are provided to the cartesian loop circuit 220 from a digital signal processor (DSP) 222. The cartesian loop circuit 220 includes the standard loop components, including the differential amplifiers/loop filters 224 and 226, the upconverter 228, the RF power amplifier chain 229, the coupler 230, the antenna 232 and the downconverter 234.

The loop circuit 220 also has a plurality of power control components. The power control components are pre-loop attenuators 236 and 238, forward path attenuators 240 and 242, forward path amplifier 243, power amplifier by-pass switch 244, feedback path attenuators 246 and 248, feedback path amplifier 250 and I and Q feedback amplifiers 252 and 254.

The power control components of FIG. 3 provide coarse and fine power control of the output of the signal from the antenna 232. The DSP 222, in accordance with one aspect of the present invention, determines the desired output power and provides the control signals to the loop circuit to control the various power control components in accordance with the desired output power. The DSP 222 also provides fine power control by controlling the amplitude of the I and Q signals supplied to the loop circuit.

Figure 4:
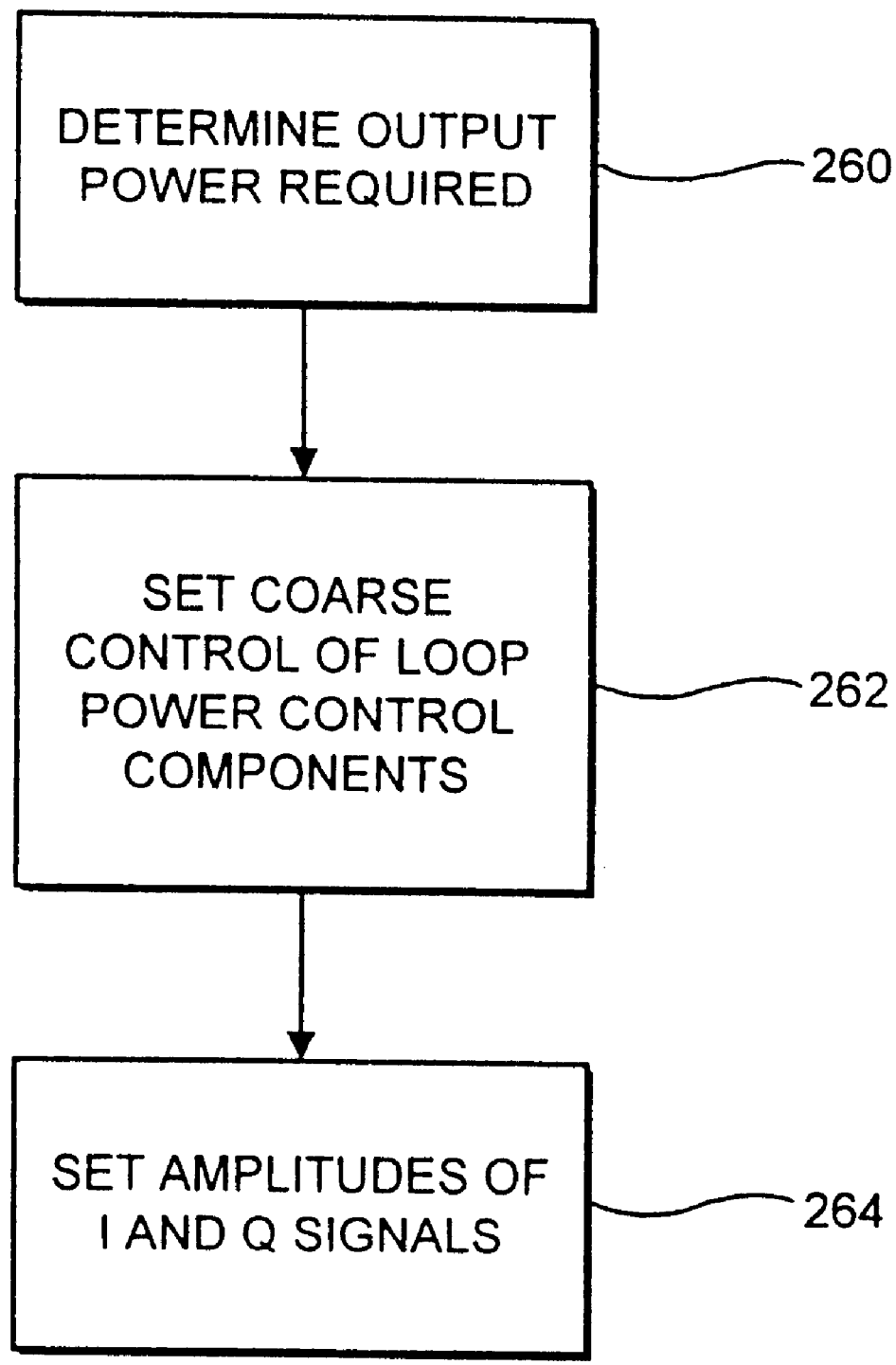
FIG. 4 illustrates the process by which a digital signal processor controls the power output of a cartesian loop circuit in accordance with one aspect of the present invention.

Referring to FIG. 4, in accordance with one aspect of the present invention, the DSP 222, or other controlling device, in step 260 determines the needed power output level at the antenna 232. Then, in step 262, the DSP 222 or other controlling device sends out control signals that set the coarse power settings of various components in the cartesian loop circuit 220. For example, if attenuators 236, 238, 240 and 242 provide a selectable coarse attenuation level, as the attenuators 104, 106, 132 and 134 in FIG. 2 did, then the DSP 222 selects the desired attenuation level of each of these components, preferably in accordance with preselected values in a look-up table, and then issues control signals to implement the desired attenuation levels. Simultaneously, the DSP 222, in step 262 calculates the necessary fine power control to implement the desired power output level at the antenna 232. The DSP 222 then selects the appropriate amplitude of the I and Q signals to finely control the output power level and sends the amplitude controlled I and Q signals to the loop circuit 220.

Referring back to FIG. 3, the power amplifier by-pass switch 244 implements another power control feature in accordance with another aspect of the present invention. The power amplifier 229 is illustrated as having two stages 256 and 258, although more stages can be implemented if desired or needed. In accordance with the present invention, the by-pass switch 244 is used to by-pass one or more amplification stages as needed to control the output power at the antenna 232. When greater power is needed, the switch 244 is opened and when lower power is needed, the switch 244 is closed. When the switch 244 is closed to bypass an amplifier stage, it is preferred to disable the power amplifier stage 268. The control of the switch 244 is preferably accomplished by the DSP 222 although any controlling device in the communication system that knows the desired output power level can control the switch 244. While FIG. 3 illustrates the switch 244 by-passing a single amplification stage, the switch 244 can be used to by-pass as many stages as desired. Of course the gain control in the forward path should be balanced with a gain control in the feedback path, so as to maintain loop gain. When the bypass switch 244 is utilized, it is preferred to control the phase of the loop to account for the change in the phase of the loop caused by a component being switched in and out. The preferred method of controlling the phase of the loop will be described later.

In FIG. 3, the attenuators 236 and 238 correspond to the attenuators 104 and 106 of FIG. 2 and can be on/off attenuators as in FIG. 2 which provide a very coarse level of power control. Alternatively, the attenuators 236 and 238 can be continuously controlled attenuators that provide a continuous range of attenuation. In this case, the attenuators 236 and 238 can be used to provide some measure of fine power control.

The attenuators 240 and 242 and the amplifier 243 of FIG. 3 correspond with the components 132, 134 and 136 in FIG. 2. Again, the attenuators 240 and 242 can be 2-4-8-8-16 attenuators or on/off attenuators as in FIG. 2 or they can be continuously variable attenuators. Similarly, the amplifier 243 can provide either on/off gain or continuously variable gain. It should be noted that if the DSP 222 is used to provide power control as previously described, it may be possible to eliminate many of the power control components in the loop 220, particularly those components that provide fine power control.

The attenuators 246 and 248 and the amplifier 250 of FIG. 3 correspond with the components 148, 150 and 152 in FIG. 2. Again, the attenuators 246 and 248 can be 2-4-8-8-16 attenuators or on/off attenuators or, alternatively they can be continuously variable attenuators. Similarly, the amplifier 250 can provide either on/off gain or continuously variable gain.

It is also possible to provide power control of the output signal with the amplifiers 252 and 254 placed after the downconverter 234 in the feedback path. Another possible method of power control is to place an attenuator 259 in the output path. Further, any of the power control components in FIG. 3, whether in loop or outside the loop, can be on/off components or can be continuously variable components.

Figure 5:
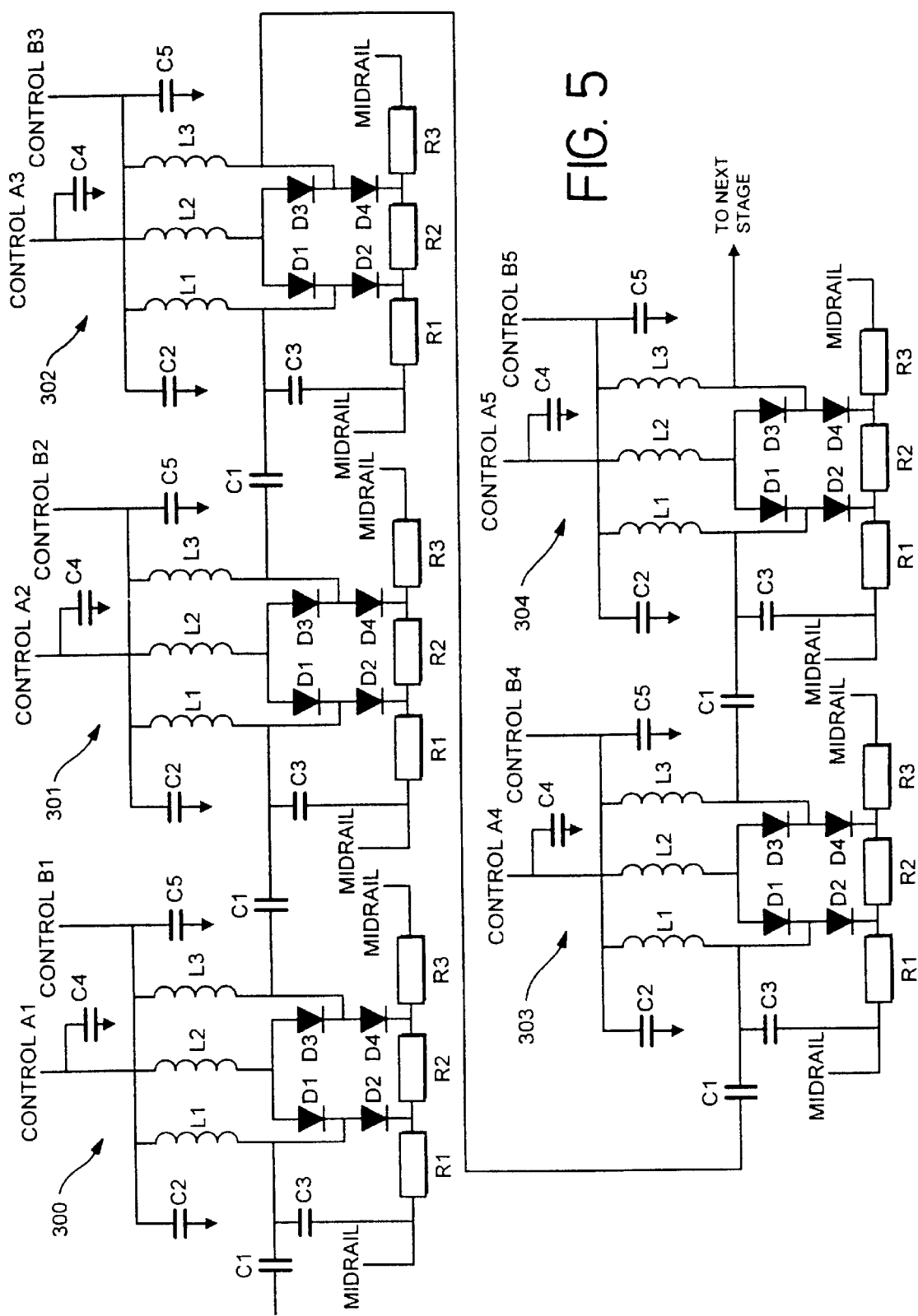
FIG. 5 illustrates a PIN diode circuit in accordance with a preferred embodiment of the present invention.

Referring to FIG. 5, the circuit diagram of the PIN diode attenuator 150 of FIG. 2 is illustrated. The circuit is a five stage 300 to 304 attenuation circuit, the stages providing 2 dB, 4 dB, 8 dB, 8 dB and 16 dB of attenuation, respectively, when enabled. Each stage consists of five capacitors C1 to C5, three inductors L1 to L3, four PIN diodes D1 to D4 and three resistors R1 to R3. The PIN diodes D1 to D4 are preferably HP/Avantak pin diodes, part number HSMP3895. The values of these components in each stage, in accordance with a preferred embodiment of the present invention, are as given in the table below:

TABLE 1

|  | Stage 1 (300) | Stage 2 (301) | Stage 3 (302) | Stage 4 (303) | Stage 5 (304) |
| --- | --- | --- | --- | --- | --- |
| C1 | 33pF | 33pF | 33pF | 33pF | 33pF |
| C2 | 33pF | 33pF | 33pF | 33pF | 33pF |
| C3 | 3.3pF | 3.3pF | 3.3pF | 3.3pF | 3.3pF |
| C4 | 33pF | 33pF | 33pF | 33pF | 33pF |
| C5 | 33pF | 33pF | 33pF | 33pF | 33pF |
| L1 | 39nH | 39nH | 39nH | 39nH | 39nH |
| L2 | 39nH | 39nH | 39nH | 39nH | 39nH |
| L3 | 39nH | 39nH | 39nH | 39nH | 39nH |
| R1 | 430Ω | 220Ω | 120Ω | 120Ω | 68Ω |
| R2 | 12Ω | 27Ω | 56Ω | 56Ω | 150Ω |
| R3 | 430Ω | 220Ω | 120Ω | 120Ω | 68Ω |

Each stage 300 to 304 has two control signals, CONTROL A and CONTROL B. To activate a stage, ie. to utilize the stage to attenuate, CONTROL A goes low and CONTROL B goes high. To deactivate a stage, CONTROL A goes high and CONTROL B goes low.

The circuit of FIG. 5 is preferred in the feedback path 128 because it provides linear high power operation which integrated circuit attenuators can not. Further, the attenuator circuit of FIG. 5 is preferred over relays as it eliminates large mechanical devices and operates more quickly.

Noise Filtering

Referring to FIG. 2, the cartesian loop circuit of the present invention includes a noise filter 138 in the loop, specifically in the forward path 126 of the loop. The filter 138 is preferably a bandpass filter having a bandwidth equal to or greater than the complete bandwidth over which the system transmits. So, for example, in a frequency hopping system where a plurality of frequencies are used, the bandwidth of the filter must permit transmission of all frequencies and protect the received frequencies from extraneous noise created by the loop. Thus, the noise filter 138 blocks frequencies generated by loop components that are within the receive band of a communication system. Any filter that accomplishes these functions can be used.

The purpose of the noise filter 138 is to filter out the noise created by the components in the loop. The baseband components in the loop have wideband characteristics which tend to create noise over a wide range of frequencies. Further, there is typically a great deal of gain in the loop so that the loop noise, including the wideband noise, is amplified. The noise filter 138 filters out this noise.

Note that, in FIG. 2, the noise filter 138 is located in the forward path 126 after the upconverter 130 and after the power control components 132, 134 and 136 but before the power amplifier 140. This is the preferred location of the bandpass filter 138 as it allows noise created by the upconverter 130 and the power control components 132, 134 and 135 to be filtered. The location of the filter 138 before the power amplifier 140 allows the filter 138 to operate on lower power signals, thereby making the filter 138 less expensive. Nevertheless, the filter 138 can be located in other positions as well. For example, the filter 138 can be located in the forward path 126 after the upconverter 130. This location of the filter 138, however, will not filter out the noise created by the power control components 132, 134 and 136. The filter 138 can also be located after the power amplifier 140, however, this location requires the filter 138 to be designed to handle a much higher power signal.

The filter 138 is particularly useful in permitting full duplex operation of the communication device employing the cartesian loop transmitter of FIG. 2. In duplex operation, the transmissions are at a high power level and at the same time the signals are received at much lower power levels. Accordingly, the duplexer 146 provides separation of the high power transmit signal and the low power receive signal. However, when the loop circuit creates wideband noise, the duplexer 148 does not fully suppress the noise in the receive band. Thus, the noise filter 138 provides improved receive band noise suppression, thereby improving full duplex operation in a radio communication system.

It is preferred, but not necessary to, implement the bandpass filter 138 with a surface acoustic wave (SAW) device. The SAW filter 138 provides improved phase response and improved linearity than other types of bandpass filters. A preferred SAW filter 138 is part number FAR-F5CC-902M50-L2EZ made by Fujitsu. Note that the center frequency of this SAW filter 138 is 902 MHz while the upconverter 130 converts the baseband I and Q signals to 896 to 901 MHz. Since the bandwidth of the noise filter 138 is wide enough, the SAW filter 138 operates acceptably.

DC Offset Nulling

Referring to FIG. 2, the cartesian loop transmitter of the present invention includes DC offset nulling circuitry 300 and 302. The first DC offset nulling circuit 300 includes a differential amplifier 302 and a sample and hold 306. The second DC offset nulling circuit 302 also includes a differential amplifier 308 and a sample and hold 310.

Both circuits 300 and 302 operate the same way and perform the same functions, except the circuit 300 nulls DC offsets in the I path and the circuit 302 nulls DC offsets in the Q path. Therefore, while the following describes the operation of the first circuit 300, it is equally applicable to both circuits 300 and 302.

The differential amplifier 304 from the first DC offset nulling circuit 300 has a first input from the output of the loop filter 118 and a second input from the reference output of the upconverter 130. This reference outputs the mid-rail reference of the power supply. In the circuit of FIG. 2, a single rail supply of about 12 volts is used so that the reference output is about 6 volts. If a dual power supply were used, for example +6 volts and −6 volts, then the mid-rail output would be about 0 volts. Thus, the differential amplifier 304 determines the DC offset between the loop filter 118 and the mid-rail reference output of the upconverter 130. Alternative measures of DC offset can also be utilized.

Figure 6:
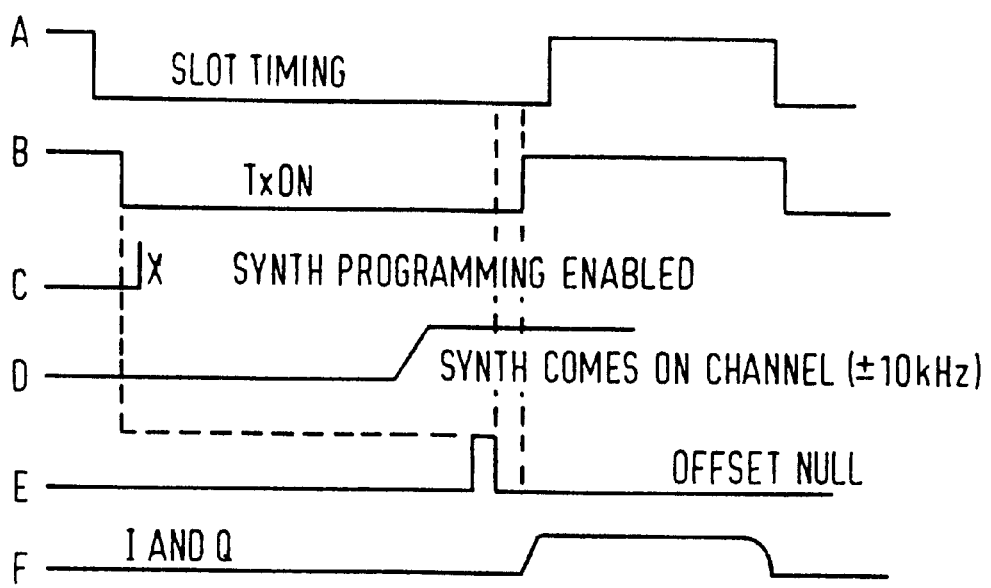
FIG. 6 illustrates a timing diagram showing the operation of the DC nulling circuit of FIG. 2 in accordance with one aspect of the present invention.

The measured value of the DC offset from the differential amplifier 304 is sent to the input of the sample and hold 306. Referring to FIG. 6, a timing diagram of the operation of the sample and hold 306 is illustrated. Line A in FIG. 6 represents the timing associated with a particular time slot in a TDMA type communication system wherein communications are provided in a plurality of time slots. When line A is high, the particular time slot is potentially active (that is, if a subscriber assigned to the time slot is trying to communicate with someone) and when the line A is low, the particular time slot is inactive. Line B represents the control signal which is provided to the power amplifier module 140 to enable and disable the forward path 126. When TxON is high, the power amplifier 140 is enabled and the forward path 126 provides an amplified signal. When TxON is low, the power amplifier 140 is disabled and the forward path 126 is disabled so that no signal is provided to the antenna 148 or to the feedback path 128. The synthesizers needed to generate the frequencies for the communication system and for the upconverter 130 and the downconverter 156 for the cartesian loop transmitter are enabled as indicated in line C of FIG. 6. The synthesizers become available with acceptable accuracy as indicated in line D.

Line E represents the preferred control signal for the sample and hold 306. When line E goes high, the sample and hold 306 begins to sample the output of the differential amplifier 304. The sample and hold 306 completes a feedback loop around the amplifier 118. The action of the feedback loop causes the voltage on the charging capacitor of the sample and hold 306 to acquire a value sufficient to minimize any DC error between the output of the amplifier 118 and the mid rail reference. When a stable charge value is reached, the sample and hold 306 is switched into hold mode as line E goes low. Note that TxON (Line B) is preferably disabled during the sampling process so that the forward path 126 is disabled and the DC offset being measured results from the DC offsets of the components in the reverse path 128.

Once the control signal on Line E goes low, the negative value of the DC offset appears on the output of the sample and hold 306. The output of the sample and hold 306 is connected to the summing point 108. Thus, the complementary value of the DC offset measured during the disablement of the forward path is added to the input to the loop filter 118, canceling the DC offset created by the components in the feedback path 128. At some later time, the control signal TxON goes high, thereby enabling operation of the forward path 126 before the time slot becomes active. The negative of the measured DC offset is added to the signal during the active time slot to null the DC offset.

Since the local oscillator affects the DC offsets, it is preferred to drive the downconverter 156 with a local oscillator during acquisition of the DC offset value. It is preferred to allow the synthesizers that supply the local oscillators to the upconverter 130 and the downconverter 156 to get as close as possible to their specified stability since the local oscillator will affect the DC offset of the upconverter and the downconverter. There can be, however, system timing constraints that require a tradeoff so that the DC offset measurement is taken before the synthesizers reach their specified stability. In this case, the DC offset measurement is taken with the synthesizers as close to their specified stability as possible.

Instability Detection

The loop circuit of FIG. 2 includes an instability detection circuit 400. The loop is designed with an appropriate amount of gain and phase delay so as to maintain the stability of the loop. Nevertheless, the loop can become unstable for number of reasons. For example, loop instability can be caused by too much loop gain or poor antenna VSWR. When the loop goes unstable, it results in the generation of out of band frequencies that generally cause the transmitted signal to break the transmission mask of the communication device. The instability detection circuit 400 detects when the loop becomes unstable and then causes appropriate action to be taken to avoid breaking the transmission mask.

The instability detection circuit 400 preferably includes a filter 402, an envelope detector 404 and a comparator 406. The circuit 400 is preferably connected to the loop circuit within the feedback path 126, after the downconverter. This location allows detection of signals at the baseband frequency regardless of the frequency at which the signal is transmitted. The circuit 400, however, can be connected to other points in the loop, but it is preferred to connect the instability detection circuit 400 to the loop to detect a baseband frequency as it simplifies the design of the filter 402.

Figure 7:
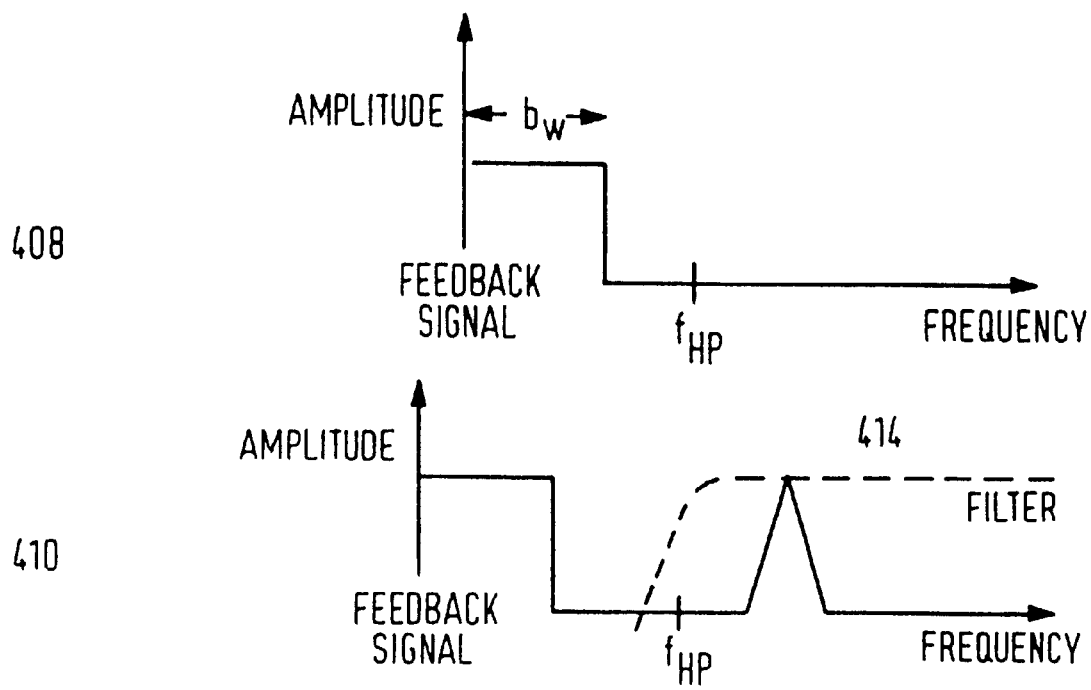
FIG. 7 illustrates a typical baseband signal generated by the loop during stable operation and a typical baseband signal generated by the loop during unstable operation.

When the loop is stable, the signal at the output of the feedback path 128 should mainly include frequencies within the bandwidth of the I and Q signals. Such a signal 408— having bandwidth, bw—is illustrated in FIG. 7. During stable loop operation, the signal 408 is input to the instability detection circuit 400. The filter 402 is preferably a high pass filter with a cutoff frequency, $f_{HP}$. Thus, the filter 402 blocks the feedback signal. The envelope detector 404, therefore, detects no signal. The comparator 406 which is comparing the output of the envelope detector 404 to a threshold th determines that there is no unwanted signals present in the loop, which indicates that the loop is operating in a stable condition.

When the loop begins unstable operation, the signal at the output of the feedback path 128 will include frequencies outside the bandwidth of the feedback signal 408. A typical signal 410 that results from unstable loop conditions is illustrated in FIG. 8. The signal 410 includes the feedback signal but also includes the noise signal 414.

When the signal 410 that results from unstable loop conditions results, the filter 402 in the instability detection circuit 400 blocks the feedback signal, but passes the noise signal 414. The envelope detector 404 detects the presence of the noise signal 414 and passes the envelope of the signal 414 to the comparator 406. If the noise signal 414 has an amplitude that exceeds the threshold, th, the comparator outputs an active signal to indicate that the loop is operating in an unstable condition.

The output of the instability circuit 400 is output to a DSP such as the DSP 222 shown in FIG. 3. When the instability circuit outputs an active signal, the DSP preferably performs one of several functions. First, the DSP attempts to adjust the phase of the loop. The method by which the phase is adjusted will be discussed later. If that action does not bring the loop back into stable operation, the DSP attempts to control the power in either the forward path 126 or the feedback path 128. While it is normally preferred to adjust the power control in a balanced fashion, as previously discussed, in this case the power adjustment is made differentially so that the power is adjusted in only one part of the loop. If this does not return the loop to stable operation, then the DSP attempts to reduce the power output of the circuit in discrete steps. If this still does not return the loop to stable operation, the DSP shuts down the transmitter.

Overheat Protection

The loop circuit of FIG. 2 includes a temperature sensor 416 which detects the operating temperature of the cartesian loop transmitter. The output of the temperature sensor 416 is connected to two comparators 418 and 420. The first comparator 418 compares the output of the temperature sensor 416 to a first threshold, th1, and the second comparator compares the output of the temperature sensor to a second threshold, th2.

When the operating temperature of the cartesian loop circuit exceeds a temperature, which is known through testing, the output of the cartesian loop can break the transmission mask. Thus, when the output of the temperature sensor 418 exceeds the threshold, th1, which is set lower than the threshold, th2, the comparator 418 outputs an active signal on OVERHEAT 1. The signal OVERHEAT1 is sent to the system controller, such as the DSP 222 in FIG. 3 or any other system controller. When OVERHEAT 1 is active, the system controller preferably causes a lower power to be transmitted by controlling the attenuation or gain of the power control components in the cartesian loop to cause a lower power output signal to be provided at the antenna 148. For example, the system controller can adjust the attenuators 104, 106, 132, 134, or 150 or the amplifiers 154, or any other device to lower the power output. The lower power output causes the signal to be transmitted within the defined transmission mask.

If the operating temperature of the loop circuit exceeds the second threshold, th2, so that the output of the second comparator 420, OVERHEAT 2, is enabled, then merely lowering the power output of the cartesian loop transmitter will not restore transmissions to the defined transmission mask. Therefore, when the second threshold th2 is exceeded and an active OVERHEAT 2 signal is sent to the system controller, the system controller preferably shuts down the cartesian loop transmitter. This ensures that the transmission mask will not be broken.

As an alternative, or in addition to the above, the loop gain can be altered differentially—that is, in either the forward path or the feedback path without balancing—to try to restore proper operation within a transmission path. Also, the phase of the loop can be changed. Any of these actions can be taken in any order with any priority.

Undervoltage Protection

The loop circuit of FIG. 2 also includes two comparators 422 and 424, which are connected to the power supply of the cartesian loop transmitter. The first comparator 422 compares the output of the power supply, V, to a first threshold, th1, and the second comparator 424 compares the output of the power supply to a second threshold, th2.

When the voltage supply falls below the first threshold, th1, the output of the cartesian loop can break the transmission mask if the loop is left to operate without any change. Thus, in accordance with one aspect of the present invention, when the power supply falls below the threshold, th1, the comparator 422 outputs an active signal on UNDERVOLTS1. The signal UNDERVOLTS1 is sent to the system controller, such as the DSP 222 in FIG. 3 or any other system controller. When UNDERVOLTS1 is active, the system controller preferably causes a lower power to be transmitted by controlling the attenuation or gain of the power control components in the cartesian loop to cause a lower power output signal to be provided at the antenna 148. For example, the system controller can adjust the attenuators 104, 106, 132, 134, or 150 or the amplifiers 154, or any other device to lower the power output. The lower power output causes the signal to be transmitted within the defined transmission mask.

If the voltage supply falls below the second threshold, th2, which is lower than the first threshold, th1, the output of the second comparator 424, UNDERVOLTS2, is enabled. When the voltage supply falls this far, then merely lowering the power output of the cartesian loop transmitter will not be enough to restore transmissions to the defined transmission mask. Therefore, when UNDERVOLTS2 is active, the system controller preferably shuts down the cartesian loop transmitter. This ensures that the transmission mask will not be broken.

As an alternative, or in addition to the above, the loop gain can be altered differentially—that is, in either the forward path or the feedback path without balancing—to try to restore proper operation within a transmission path. Also, the phase of the loop can be changed. Any of these actions can be taken in any order with any priority.

Pulse Shaping For Time Hopping Systems

When a cartesian loop is used to provide linear amplification in a communication system transmitter that employs TDMA—wherein the transmissions on the communication system occupy a plurality of time slots—it is preferred to control the operation of the power amplifier 140 during the initial part of a time slot when it first becomes active.

This is preferably accomplished by sending the TxON signal, which is sent to the power pin of the amplifier 140 to control the output of the amplifier 140, through a shaping circuit 450. The shaping circuit 450, for the case of FIG. 2, is a simple RC filter, using a resistance of 2.2 kΩ and a capacitance of 22 nF. The shaping circuit 450 therefore causes the input to the power pin of the power amplifier 140 to increase slowly when it is first turned on during an active slot.

This delay allows the loop gain around the loop 126 and 128 to be established before a high power signal is transmitted, thereby allowing the loop to implement its corrections and to prevent spurious signals that may be caused by the components in the loop before stable operation begins. For example, DC offsets in the forward path are not corrected until the signal has traveled around the loop. Also there are local oscillator leakage problems to contend with. By delaying the transmission of the signal for a length of time sufficient for the signal to travel around the loop, improved operation is achieved.

Phase Calibration As A Function Of Power And Frequency

Referring to FIG. 2, the phase of the loop can be set by a manual phase adjuster 460 and by a computer controlled phase adjuster 462. The manual phase adjuster 460 can be used to set up the phase of the loop. The computer controlled phase adjuster 462, in accordance with another aspect of the present invention, is controlled in accordance with the power output levels of the loop and with the frequency of the signal being transmitted, to cause a shift in the local oscillator that drives the downconverter 156.

In accordance with a preferred embodiment of the present invention, where the signal is being transmitted over one of a plurality of frequency channels in a frequency hopping fashion, the control computer, such as a DSP 222, determines the transmit frequency of the signal. The control computer then accesses a lookup table to determine the appropriate phase control setting for the downconverter's 156 local oscillator and then sets the computer controlled phase adjuster 462 accordingly. In the case of FIG. 2, where the signal is transmitted over a 3 MHZ band of frequencies, the lookup table divides the band into three bands and controls the phase adjuster 462 in approximately 20° steps. Of course, the exact implementation will vary with each application.

The phase of the loop is also preferably controlled as a function of the power control of the loop. As the power control components in the loop are switched in and out, the phase of the loop changes. Therefore, in accordance with the present invention the control computer, such as a DSP 222, maintains a table of the possible loop phases that can result when the various loop power control components are switched in and out of the loop. As part of the power control function, the DSP 222 accesses the table to determine the appropriate loop phase for the particular loop configuration and controls the phase adjuster 462 to adjust the loop phase accordingly. Thus, as each power control component is switched in and out, the loop phase is adjusted.

Referring to FIG. 2, the control computer changes the phase of the loop as any of the attenuators 132, 134, 150 and 152 or the amplifiers 136 and 154 are switched in or out. In FIG. 3, the control computer, the DSP 222, changes the phase of the loop as any of the power control components 224, 226, 240, 242, 243, 256, 258, 246, 248, 250, 252 or 254 are switched in or out of the loop. This includes when the bypass switch 244 switches the amplifier stage 258 in or out of the loop.

It is understood that changes may be made in the above description without departing from the scope of the invention. It is accordingly intended that all matter contained in the above description and in the drawings be interpreted as illustrative rather than limiting.

We claim:

1. A cartesian loop for transmitting base band signals, said cartesian loop operating in a communication system having a plurality of time slots, said cartesian loop comprising:
   a forward path having a first input for the baseband signals and a second input, the forward path including means to upconvert the input signals to an RF signal for transmission;
   a feedback path for providing an error signal input indicative of the non-linearity of the forward path to the second input of the forward path, the feedback path having an input from the forward path and means to downconvert the input from the forward path;
   control means for disabling the input to the feedback path;
   means for sensing and acquiring a DC offset in the feedback path when the forward path is disabled; and
   means for subtracting the DC offset from the feedback path;
   wherein the DC offset is stored before the time slot in which communication is to take place, becomes active.

2. The claim of claim 1, wherein a local oscillator is supplied to a downconverter when the input to the feedback path is disabled.

3. The claim of claim 1, wherein the control means turns off a power amplifier in the forward path.

4. The claim of claim 1, wherein a coupler provides the input to the feedback path from the forward path and wherein the control means disables the coupler.

5. The claim of claim 1, wherein the cartesian loop includes an upconverter and a downconverter and frequency synthesizers supply the cartesian loop with local oscillator signals for the upconverter and the downconverter and wherein the DC offset is stored when the frequency synthesizers have reached a predetermined stability.

6. A cartesian loop transmitter comprising
   (A) input means for receiving a baseband signal to be transmitted and for receiving an error signal;
   (B) a forward path that includes:
      (1) an upconverter for converting the signal from the input means to an RF signal; and
      (2) gain control means for controlling the gain of the RF signal;
   (C) a feedback path that generates the error signal, the error signal being indicative of the non-linearity of the forward path, the feedback path including:
      (1) means to couple to the output of the forward path to generate a feedback signal;
      (2) a downconverter for converting the feedback signal to the error signal;
   (D) means for disabling the feedback signal;
   (E) means for measuring the DC voltage on the feedback path;
   (F) a differential amplifier having a first input from the means for measuring the DC voltage on the feedback path and a second input from a reference signal;
   (G) a sample and hold connected to the output of the differential amplifier;
   (H) means for causing the sample and hold to acquire the measured DC voltage on the feedback path when the means for disabling the feedback signal is enabled; and
   (I) means for subtracting the acquired DC voltage from the feedback path.

7. A cartesian loop for transmitting baseband signals over a frequency band, comprising:
   a forward path having a first input for the baseband signals and a second input, the forward path including:
      means to upconvert the input signals,
      a noise filter located after the means to upconvert the input signals, to block frequencies outside of the frequency band over which signals are transmitted,
      a power amplifier, to amplify the filtered upconverted signals, to produce a signal to be transmitted, and
      an output for the signal to be transmitted; and
   a feedback path for providing an error signal indicative of the non-linearity of the forward path to the second input of the forward path, the feedback path having an input from the output of the forward path and means to downconvert the input from the output of the forward path, wherein the loop is used in a communication system that receives signals in a receive band of frequencies, and wherein said noise filter blocks frequencies generated by the components in the cartesian loop that are within the receive band of frequencies.

8. The cartesian loop of claim 7, being adapted to transmit the signal to be transmitted over one of a plurality of frequency channels, wherein the noise filter has a bandwidth approximately equal to the frequency band of the plurality of frequency channels.

9. A cartesian loop for transmitting baseband signals over a frequency band, comprising:
   a forward path having a first input for the baseband signals and a second input, the forward path including means to upconvert the input signals to a signal to be transmitted and a plurality of power amplifier stages;
   a feedback path for providing an error signal indicative of the non-linearity of the forward path to the second input of the forward path, the feedback path having an input from the forward path and means to downconvert the input from the forward path;
   means for selectively disabling one or more power amplifier stages to control output power; and
   means for controlling the phase of the cartesian loop in accordance with the disabled power amplification stages.

10. A method of transmitting baseband signals over a frequency band with a cartesian loop, comprising the steps of;
   in a forward path, upconverting the baseband signals and power amplifying the upconverted signals;
   feeding back a portion of the output of the forward path and downconverting the feedback signal to provide an error signal indicative of the non-linearity of the forward path to correct the non-linearities of the forward path;
   selectively disabling one or more power amplifier stages to control output power; and
   controlling the phase of the cartesian loop in accordance with the disabled power amplification stages.

11. A method of transmitting baseband signals over a frequency band with a cartesian loop, comprising the steps of:
   in a forward path, upconverting the baseband signals and power amplifying the upconverted signals with a power amplifier having a power control pin;
   feeding back a portion of the output of the forward path in a feedback path and downconverting the feedback signal to provide an error signal indicative of the non-linearity of the forward path to correct the non-linearities of the forward path;

selectively controlling the power control pin in accordance with the desired output power from the cartesian loop; and selectively controlling an amount of gain/attenuation in the feedback path, so that overall loop gain is maintained.

12. A method as claimed in claim 11, comprising:

generating the baseband signals in a digital signal processor;

selectively controlling the power control pin to provide coarse adjustments to the output power; and providing fine adjustments to the output power by selecting appropriate amplitudes for the baseband signals from the digital signal processor.

13. A cartesian loop for transmitting baseband signals over a frequency band, comprising:

a forward path having a first input for the baseband signals and a second input, the forward path including means to upconvert the input signals to a signal to be transmitted, an attenuator having selectable attenuation and a plurality of power amplifier stages;

a feedback path for providing an error signal indicative of the non-linearity of the forward path to the second input of the forward path, the feedback path having an input from the forward path, a PIN diode attenuator having selectable attenuation and means to downconvert the input from the forward path.

14. The claim of claim 13, wherein the attenuation selected in the forward path equals the attenuation selected in the reverse path.

15. A method of transmitting baseband signals over a frequency band with a cartesian loop, comprising the steps of:

in a forward path, upconverting the baseband signals, selectively attenuating the upconverted signals and power amplifying the upconverted signals;

feeding back a portion of the output of the forward path, selectively attenuating the feedback signal with a PIN diode circuit and downconverting the feedback signal to provide an error signal indicative of the non-linearity of the forward path to correct the non-linearities of the forward path.

16. The method of claim 15, wherein the attenuation selected in the forward path equals the attenuation selected in the reverse path.

17. A cartesian loop for transmitting baseband signals over a frequency band, comprising:

a forward path having a first input for the baseband signals and a second input, the forward path including means to upconvert the input signals to a signal to be transmitted, an attenuator having selectable attenuation, an amplifier having selectable amplification and a plurality of power amplifier stages; and a feedback path for providing an error signal indicative of the non-linearity of the forward path to the second input of the forward path, the feedback path having a input from the forward path, an attenuator having selectable attenuation, an amplifier having selectable amplification and means to downconvert the input from the forward path.

18. The claim of claim 17, wherein the gain selected in the forward path equals the gain selected in the reverse path.

19. A method of transmitting baseband signals with a cartesian loop over a frequency band, comprising:

in a forward path, upconverting the baseband signals to a signal to be transmitted, selectably attenuating the signal, selectably amplifying the signal and power amplifying the signal; and feeding back a portion of the output of the forward path, selectably attenuating the signal, selectably amplifying the signal and downconverting the feedback signal to provide an error signal indicative of the non-linearity of the forward path to the forward path.

20. The claim of claim 19, wherein the gain selected in the forward path equals the gain selected in the reverse path.

21. A cartesian loop for transmitting baseband signals over a frequency band, comprising:

means for controlling the gain of the baseband signals;

a forward path having a first input for the gain controlled baseband signals and a second input, the forward path including means to upconvert the input signals to a signal to be transmitted, gain control means for selectably controlling the gain of the signal in the forward path and a plurality of power amplifier stages;

a feedback path for providing an error signal indicative of the non-linearity of the forward path to the second input of the forward path, the feedback path having a input from the forward path, gain control means for selectably controlling the gain of the signal in the feedback path and means to downconvert the input from the forward path.

22. The claim of claim 21, wherein fine control of the cartesian loop power output is provided by the means for controlling the gain of the baseband signals and coarse control of the cartesian loop power output is provide by controlling the gain control means in the forward and feedback paths.

* * * * *